United States Patent
Festø et al.

(10) Patent No.: US 7,739,522 B2
(45) Date of Patent: Jun. 15, 2010

(54) EFFICIENT POWER SUPPLY FOR RAPIDLY CHANGING POWER REQUIREMENTS

(75) Inventors: Asle Festø, Laksevåg (NO); Kjetil Onarheim, Fyllingsdalen (NO); Karl Martin Gjertsen, Fana (NO)

(73) Assignee: Nera ASA, Kokstad (NO)

( * ) Notice: Subject to any disclaimer, the term of this patent is extended or adjusted under 35 U.S.C. 154(b) by 1089 days.

(21) Appl. No.: 10/576,600

(22) PCT Filed: Oct. 22, 2004

(86) PCT No.: PCT/NO2004/000323

§ 371 (c)(1),
(2), (4) Date: Apr. 21, 2006

(87) PCT Pub. No.: WO2005/041404

PCT Pub. Date: May 6, 2005

(65) Prior Publication Data

US 2007/0052477 A1 Mar. 8, 2007

(30) Foreign Application Priority Data

Oct. 24, 2003 (NO) .................................. 20034776

(51) Int. Cl.
*G06F 1/26* (2006.01)
(52) U.S. Cl. ...................................... 713/300; 330/199
(58) Field of Classification Search ................. 330/199; 713/300
See application file for complete search history.

(56) References Cited

U.S. PATENT DOCUMENTS

| | | | |
|---|---|---|---|
| 5,589,754 A | 12/1996 | Heikkila | |
| 5,905,407 A | 5/1999 | Midya | |
| 6,300,826 B1 | 10/2001 | Mathe et al. | |
| 7,099,635 B2 * | 8/2006 | McCune | 455/110 |
| 2003/0148792 A1 | 8/2003 | Kimball et al. | |

FOREIGN PATENT DOCUMENTS

| | | |
|---|---|---|
| WO | WO 95/34128 | 12/1995 |
| WO | WO 03/073604 | 9/2003 |

OTHER PUBLICATIONS

Dale R et al, High-Efficiency High-Level Modulator for Use in Dynamic Envelope Tracking CDMA RF Power Amplifiers, 2001 IEEE MTT-S Digest p. 1509-1512.
Gary Hanington et al, IEEE Transactions on Microwave Theory and Techniques, vol. 47, No. 8, Aug. 1999 High-Efficiency Power Amplifier Using Dynamic Power-Supply Voltage for CDMA Applications, see p. 1471-1476.

* cited by examiner

*Primary Examiner*—Tse Chen
(74) *Attorney, Agent, or Firm*—Young & Thompson (57) ABSTRACT

A highly efficient power supply, a method for supplying power, and a method for arranging a power supply, for a UHF or microwave radio frequency amplifier intended for operation with a signal that has a power level which varies at a high frequency rate. The power supply has an output for connecting to a power supply input of the radio frequency power amplifier and includes a high rate controllable voltage supply employing electronic linear devices connected to the output, an element for quantifying power dissipated by the electronic linear devices and a low rate controllable current supply connected to the output. Preferably, the current supply is a substantially constant current supply at the frequency of the radio frequency signal. Preferably, the controllable voltage supply has a control input and is arranged to be controlled for outputting a voltage that is a function of the high frequency power variation.

28 Claims, 9 Drawing Sheets

Most basic construction

Figure 1 - Conventional transmission chain

PRIOR ART

Figure 2 - First step of improvement

PRIOR ART

Figure 3 - Biasing for time variant signal amplitude

PRIOR ART

Figure 4 - Most basic construction

R

Figure 5 - Power supply dissipation chart

Figure 6 - Conceptually simplest implementation

Figure 7 - HW effective implementation

Figure 8 - First self-optimizing supply

Figure 9 – Self-adjusting, self-optimizing supply

Implementation of a current source

Figure 10 – Basic Current source arrangement

Implementation of an indirectly controlled current source

Figure 11 - Indirectly controlled current source

Figure 12 - Discrete BBA solution

Figure 13 - Basic use of dynamic supply

Figure 14 - HPA biased by envelope control

Figure 15 - Digital envelope control

Figure 16 - HPA biased for burst traffic

Figure 17 - Amplitude Modulated HPA

EFFICIENT POWER SUPPLY FOR RAPIDLY CHANGING POWER REQUIREMENTS

1. FIELD OF THE INVENTION

The present invention is related to the field of highly efficient electronic power supplies for supplying power to a load having a power requirement that varies at a high frequency. In particular, the present invention relates to a highly efficient power supply for a UHF or microwave radio frequency amplifier intended for operation with a signal that has a power level which varies at a high frequency.

1. BACKGROUND

It is of high importance to keep down power consumption in modern radio communication equipment. Depending on the specific case this relates to cost, heat dissipation/temperature and battery life.

The transmit power amplifier accounts for a significant fraction of the total power consumption, so any improvement in its efficiency is of interest.

Advanced radio equipment normally carries waveforms spanning a significant dynamic range. At the same the emitted signal has to comply with strict frequency masks, resulting in the need for very linear amplifiers. Normally this has been achieved by employing Class A amplifiers capable of transmitting the highest signal level without significant distortion, inevitably leading to very poor power added efficiency, as the amplifier supply continuously allows for a signal of maximum amplitude.

There has been obtained some efficiency improvements by changing the power supply state as the signal level changes.

2. THE PROBLEM AREAS

Figure 1:
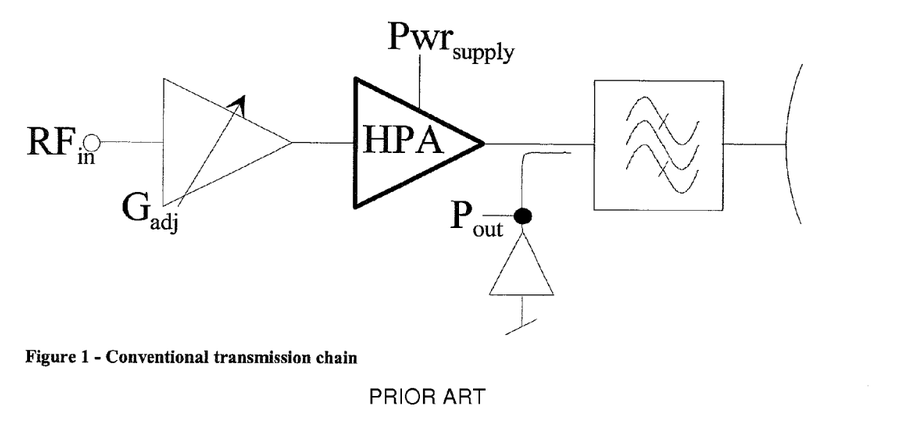
FIG. 1 is a block schematic representation of a well known and conventional radio frequency power amplifier chain.

It is common knowledge to describe the power amplifier section of a transmitter basically like it is illustrated in the accompanying FIG. 1. The $Pwr_{supply}$ is a fixed arrangement, supplying sufficient power to manage all signal levels of interest, possibly adjusted if $G_{adj}$ is changed to set a different output power level. As is shown, there is a minimum of signal processing units after the high power amplifier, HPA. The dearly bought signal power level is fed to the antenna with minimum loss. Power level detection and output band pass filtering are normally necessary. The HPA itself can be implemented by means of an integrated amplifier, discrete transistors (Bipolars or FETs) or a transistor network. For the sake of description, let us assume that the gain of the HPA is high enough to consider the preceding parts as low-power circuits.

The above approach is open for improvements guided by the idea of adjusting the HPA bias supply as needed by the instantaneous signal amplitude. This approach seems viable if we have a narrowband modulated signal. The obvious benefits from such a solution comes from the fact that most radios will have a modulation rate that is fast compared to thermal timescales and power supply smoothing. Thus, improvements promise less trouble with heat removal and smaller power supplies.

Figure 2:
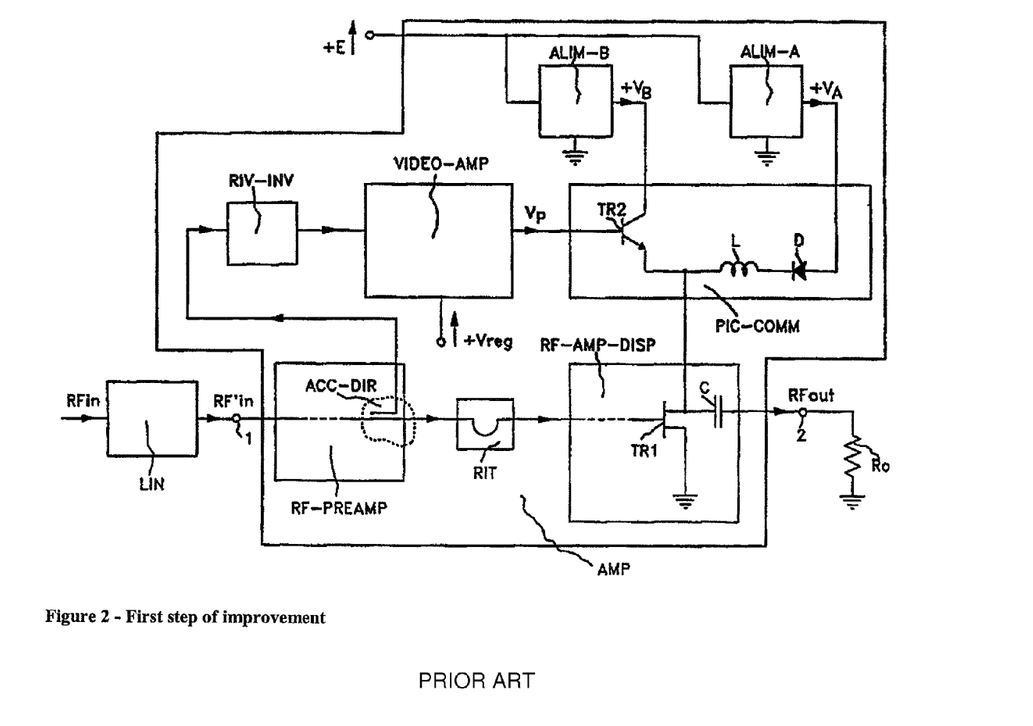
FIG. 2 is a block schematic representation of a known improvement to a power supply for a radio frequency power amplifier.

A first step of improvement is achievable by the before mentioned invention disclosed by Abbiati et al in WO95/34128, under the title "Linear Microwave Power Amplifier with Supply Power Injection controlled by the Modulation Envelope". The basic idea is shown in FIG. 2. We recognize the signal path from RFin to RFout, where the HPA is detailed by RF-AMP-DISP.

The concept disclosed by Abbiati et al focuses on controlling the Drain voltage of a FET stage. As drain voltage variations have a minor impact on FET amplifier performance in class A operation, the solution promises acceptable RF functionality and a degree of freedom for power saving, brought about by the PIC-COMM unit where two voltage sources are allowed to cooperate on feeding the required current to the amplifier. ALIM-A delivers a lower voltage than ALIM-B and feeds the bulk of the current. ALIM-B is used to control the drain voltage through TR2 and feed some extra power at peak levels. As the gate bias voltage of the FET is not subject to change, the current in the FET is almost constant. This is a prerequisite for the solution to work and also a limitation to the obtainable benefits, as it would be advantageous to simultaneously reduce both voltage and current for low signal levels.

We propose a new solution that brings the power added efficiency to a higher level by offering dynamic control of both supply voltage and current in the HPA. This also enables the use of the bias scheme for other amplifiers than FETs. The degrees of freedom offered may clearly influence the amplifier properties of the HPA, enabling us to utilize the invention both for power savings and for control of operation.

2.1 In the Following, Linear Amplification of a Narrowband Signal is Discussed To understand the objective and benefits of the invention, a brief introduction to the role of the HPA is given.

It is common to employ both phase and amplitude modulation to generate the transmitted signal in modern radio communication equipment. This calls for very linear amplifier solutions, working over a large dynamic range. The modulated signal may be described mathematically as $s(t)=Re[a(t) \cdot e^{j \cdot (\omega \cdot t + \phi(t))}]$. Here $\omega$ is the center frequency of the modulated signal, while $a(t)$ and $\phi(t)$ represent the modulation. The frequency content of $a(t)$ and $\phi(t)$ constitutes the modulation bandwidth, covering some decades from the maximum value ($f_{mod}$) towards DC. The center frequency typically is a couple of decades higher than $f_{mod}$. The form of amplitude modulation, $a(t)$, is completely determined by the modulation type, allowing us to introduce useful characteristics for the following description:

$a_{peak}$ is the largest value occurring for $a(t)$.

$a_{ave}$ is the average amplitude in the modulated signal.

The ratio $a_{peak}/a_{ave}$ is called the peak-to-average ratio, and is independent of the actual power level of the signal.

As the amplifiers have to give linear gain to a signal spanning a significant dynamic range, given by $a(t)$, a fixed bias class A operation results in very low overall power added efficiency. Possible improvements may be introduced by allowing the power supplies to adjust to the instantaneous signal level $a(t)$.

Figure 3:
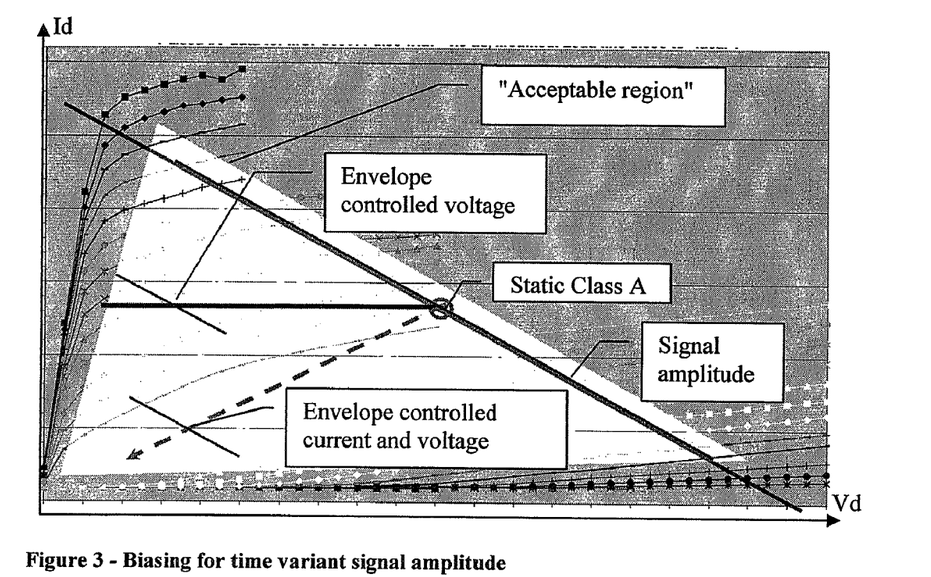
FIG. 3 is a chart diagram representation of biasing for a time variant signal amplitude in a radio frequency amplifier shown in part in FIG. 2.

2.2 In the Following, Biasing Semiconductors for Linear Amplification is Discussed Examining a standard picture of the I-V curves of a transistor with load line and point of operation shows a potential for reduced bias power consumption like illustrated in FIG. 3. The plot shows the usual family of curves for the device current as a function of applied voltage for different control signals (gate voltage or base current), being applicable to FET's as well as bipolars. Presenting a given load to the device output defines the slope of a load line, while the actual bias point setting defines its position. A given location is characterized by the quiescent voltage, V and current I, also called the bias voltage and current.

If the amplifier receives a signal of fixed amplitude, the bias point has to be set such that the necessary travel along the load line happens within an acceptable region of the I-V plane for the amplifier. Defining the "acceptable region" is outside the scope of this text. For our purpose it serves to say that the active load line segment has to be placed somewhere within this region. As illustrated in FIG. 3; at a maximum signal level the bias point is forced to a specific location. The amplifier can service all possible signal levels operating at this bias point. The cost is high power consumption in the amplifier. When the signal strength is reduced, the bias point may be set at will wherever the load line segment falls within the "acceptable region". The first step of improvement mentioned above describes a way to reduce the bias voltage V to become a function V(a(t)). The power consumption V·I clearly will be reduced. The proposed invention gives an efficient way to minimize power consumption by letting the bias current I also become a function of signal amplitude, I(a(t)). The description is made for class A. Reduced power consumption for amplification of signals with amplitude variation may be obtained for example for class A-B, B and C—all capable of successful operation at different bias conditions when varying the signal amplitude.

In any case, an amplifier working at a signal with amplitude modulation a(t) has the potential to reduce its power consumption by allowing the bias supply to adjust voltage and current with signal amplitude. The forms of the functions applied are not considered here, but we assume that they will be nonlinear and may vary significantly depending on the application, the amplifier device and performance tradeoffs.

The amplitude a(t) of the actual signal is assumed to be known. In a digital modulator, the amplitude may be easily calculated and provided. For different reasons one may have to use a fast detector and timing alignment as shown in FIG. 2.

If the modulation bandwidth is narrow, one may use an adjustable, high efficiency DC-DC converter to provide the correct bias voltage, delivering the appropriate current. The current will be set either by changing the bias of the input terminal (gate or base) for class A or A-B circuits, or simply be an effect of the signal level for class B or C circuits.

For higher bandwidths there is need for different approaches. As we have not come across suitable solutions for feeding power to this kind of amplifiers, the following invention is presented. This invention enables power efficient supply to loads requiring rapidly changing voltage and current.

3. BRIEF DESCRIPTION OF THE INVENTION

The present invention provides an electronic power supply circuit, particularly for providing power to an ultra high or microwave radio frequency power amplifier, a radio frequency amplifier assembly that includes the power supply circuit, and a variable gain power amplifier circuit assembly for providing high level modulation of an ultra high or microwave radio frequency signal, which variable gain amplifier includes the electronic power supply circuit.

The present invention provides a power supply, a method for supplying power and a method for providing a power supply.

Other advantageous features of the present invention are recited in the accompanying dependent patent claims.

Advantageously, the present invention includes a constant voltage source that is set to provide a voltage that corresponds to the maximum voltage required for the amplifier to operate according to its specifications in an application of interest. Thus, the overall power efficiency may be at an optimum.

For controlling the consumption of the amplifier, advantageously to reduce excess power dissipation in the amplifier, due to, for example, excess quiescent current, employing an amplifier with controllable current consumption, being controlled in accordance with the power level of a signal to be amplified, is particularly advantageous in conjunction with a power supply or method according to the present invention.

Preferably, the controllable voltage supply part of the present invention is controllable at a rate in the range of about 1 MHz to about 100 MHz, corresponding to a high frequency rate power variation of the RF signal to be amplified by the amplifier to which power is supplied by the power supply of the present invention.

Also preferably, is the controllable current supply part of the present invention is controllable at a rate in a range below 1 MHz, being substantially less than a high frequency power variation rate of the RF signal to be amplified by the amplifier to which power is supplied by the power supply of the present invention.

The basic challenge is: How do we effectively supply a device that demands current I(t) at voltage V(t) when the rate of change is higher than what available power supplies can handle in the specific case?

The bandwidth limitations may be different at different power levels, but the question remains the same.

Possible variations in signal level are separated into two categories; fast and slow variations. We assume that slow variations are slow enough to be taken care of by programming the power supplies, while our invention takes care of the fast variations.

Fast variations are characterized by a time constant τ defining a sufficient averaging time period for the quantities of interest, specified as follows:

$$P_{ave} = \frac{1}{\tau} \int_{T}^{T+\tau} I(t) \cdot V(t) \cdot dt \qquad \text{Equation 1}$$

$$I_{ave} = \frac{1}{\tau} \int_{T}^{T+\tau} I(t) \cdot dt$$

$$V_{ave} = \frac{1}{\tau} \int_{T}^{T+\tau} V(t) \cdot dt$$

The average power needed by the amplifier obviously is $P_{ave}$.

In addition the highest value that occurs for V(t) is named $V_{peak}$.

Since we take the power from fixed-value power supplies, we have been seeking arrangements of supplies that minimize the power loss from supplies to amplifier. A solution has emerged that promises significantly better performance than the solution indicated in FIG. 2, leading to a basic construction illustrated in FIG. 4.

Figure 4:
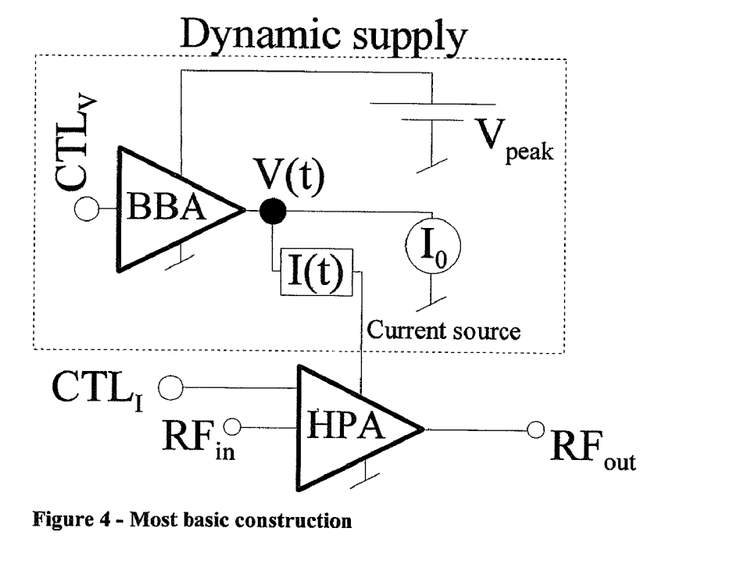
FIG. 4 is a block schematic diagram of a basic construction of a dynamic supply according to the present invention.

Put into words, we have devised a fast and effective power supply by the use of a current source aided by a base band amplifier (BBA) that can source or sink current as needed within an output range limited by $V_{peak}$. The power supplies in this construction are not required to make fast changes. On the contrary; for effective operation it is assumed that they are fixed supplies at the averaging timescale, τ. The actual voltage delivered from the source is set by $CTL_V$ in the power supply. Depending on the application, the current drawn may be set by a control at the signal amplifier, $CTL_I$, or simply be a result of the signal level. In both cases the supply circuit will see a time variable load. The solution relates to the need for an amplifier supply, but the amplifier itself is not part of the solution. In FIG. 4 the invention is described within the stippled rectangle, basically being a fast voltage supply able of delivering rapidly varying current in a prescribed range.

For effective operation it is assumed that the averages from Equation 1 are valid.

The current source will constantly deliver the current $I_0$, representing a power contribution $$P_I = I_0 \cdot V_{ave} \qquad \text{Equation 2}$$

The voltage source will constantly deliver the voltage $V_{peak}$, representing a power contribution $$P_V(I_0) = V_{peak} \int_T^{T+\tau} \frac{1}{\tau} \cdot \text{Max}(I(t) - I_0, 0) \cdot dt \qquad \text{Equation 3}$$

The integral in this equation obviously is the average current flowing from $V_{peak}$. We name it $I_{peak}(I_0)$. If we measure this current, we can calculate the total power consumption $P_{Cons}$:

$$P_{cons}(I_0) = P_I + P_V(I_0) \qquad \text{Equation 4}$$

$$= V_{ave} \cdot I_0 + V_{peak} \cdot I_{peak}(I_0)$$

$$= V_{ave} \cdot \left[ \frac{V_{peak}}{V_{ave}} \cdot I_{peak}(I_0) + I_0 \right]$$

To find a criterion for minimum $P_{cons}(I_0)$, we investigate if the derivative is an upwards monotonic function with zero crossing, essentially being translated to a question about the behavior of $I_{peak}(I_0)$.

To estimate the integral in Equation 3, the cumulative frequency of current consumption is introduced:

$$f(I_0) = \int_T^{T+\tau} \frac{1}{\tau} \cdot if\,(I(t) > I_0, 1, 0) \cdot dt, \qquad \text{Equation 5}$$

where $$I(t) > I_0.$$

basically finding the fraction of time

If $I_0$ increases, the if-statement will change from true to false at some instants, telling that $f(I_0)$ has a negative derivative, starting at 1 and ending at 0.

The function $I_{peak}(I_0)$ now can be developed to show its derivative:

$$I_{peak}(I_0) = \int_T^{T+\tau} \frac{1}{\tau} \cdot if\,(I(t) > I_0, 1, 0) \cdot (I(t) - I_0) \cdot dt \qquad \text{Equation 6}$$

$$\frac{dI_{peak}(I_0)}{dI_0} = \int_T^{T+\tau} \frac{1}{\tau} \cdot \left[ \frac{d(if\,(I(t) > I_0, 1, 0))}{dI_0} \cdot (I(t) - I_0) - if\,(I(t) > I_0, 1, 0) \right] \cdot dt$$

$$= -f(I_0)$$

The evaluation of derivative mentions the non-existent derivative of the if-statement, identifying the instants where $I(t)=I_0$. Since the expression is multiplied by $I(t)-I_0$, a shift in the logical test has no effect.

The derivative of $I_{peak}(I_0)$ turns out to provide a very elegant derivative for $P_{cons}(I_0)$:

$$\frac{dP_{cons}(I_0)}{dI_0} = V_{ave} \cdot \left[ 1 - \frac{V_{peak}}{V_{ave}} \cdot f(I_0) \right]. \qquad \text{Equation 7}$$

Since $V_{peak} > V_{ave}$, Equation 7 tells that $P_{cons}(I_0)$ has a unique minimum that may be obtained either by analyzing the actual current distribution to find the value of $I_0$ where $f(I_0) = V_{ave}/V_{peak}$, or simply by live measurement of $I_{peak}(I_0)$ to evaluate and minimize the change in $P_{cons}(I_0)$ by use of feedback to change $I_0$.

There are two steps in this core formulation of the invention.

The first step is referenced by the box-framed subcircuit of FIG. 4, showing a way to control a rapidly changing voltage V(t) to a load demanding a current I(t) with as rapid changes. To operate the circuit, we assume a control voltage $CTL_V$ to set the desired voltage. We also need to set the current level $I_0$, which strongly affects the efficiency of the supply circuit.

The second step of the core invention tells how to set the current level $I_0$ to arrive at an optimum efficiency of the supply circuit. Based on the existence of a global optimum without local traps that only depend on $V_{peak}/V_{ave}$ and the current distribution in the actual signal, a couple of approaches are attractive in different applications:

1. Analyze the requested current distribution and find the ratio $I_0/I_{ave}$ for optimum efficiency. This may be used as a level independent parameter if the level of operating power is changed. Alternatively the correct $I_0$ may be explicitly set for fixed-level operation. The analysis may be carried out theoretically or experimentally.
2. Establish real-time measurement of $I_{peak}$ to evaluate $P_{cons}$, being the feedback value for adjustment of $I_0$ to arrive at a minimum. The current measurement method is not described in detail.

Specific implementations are proposed in the following sections.

4. DESCRIPTION OF THE ACCOMPANYING DRAWINGS

In the accompanying drawings.

4.1 A Discussion of Load Profiles and Supply Efficiency

The proposed power supply is very power efficient if the distribution of the load points given by (V(t),I(t)) over an averaging time period τ suits the profiles of power dissipation in the power supply.

In principle the dissipation within the supply occurs when the load demands a current that is different from $I_0$.

Given the actual $V_{peak}$, $I_0$ and delivered voltage and current, V and I, the dissipation is $$P_{diss}(V_{peak}, I_0, V, I) = \text{if}(I > I_0, (V_{peak} - V) \cdot (I - I_0), V \cdot (I_0 - I)) \quad \text{Equation 8}$$

Figure 5:
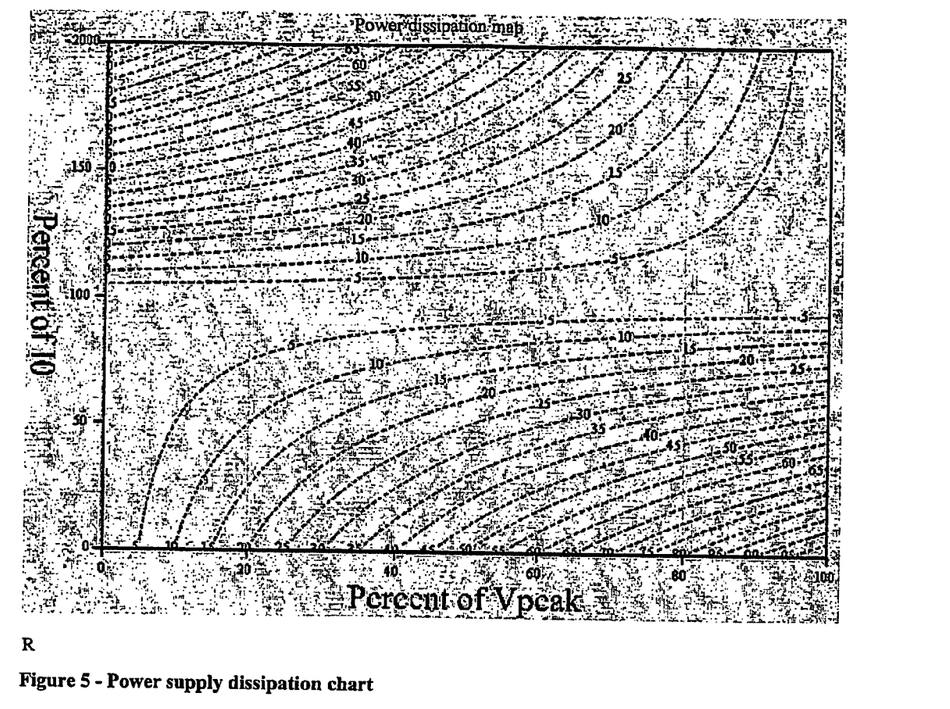
FIG. 5 is a chart diagram representation of power supply dissipation.

Based on this equation we may plot dissipated power within the supply. FIG. 5 shows a plot where the dissipation is calculated relative to $V_{peak} \cdot I_0$.

The distribution of operating points for a specific case may be plotted as a probability density map on the same plane, often being a trace of I(V). Since we are free to optimize the value $I_0$, this density map can be placed at a convenient position along the $I_0$ axis, allowing major parts to fall into the regions of low supply dissipation. For loads with positive resistance, a density map will cover an area tilted from lower left to upper right. This again is favorable with respect to obtaining a high efficiency. For specific HPA loads we have seen that more than 90% of total dissipated power is delivered at the load.

5. ALTERNATIVE EMBODIMENTS OF THE INVENTION

The core invention can be brought into operating hardware in many ways. Some apparently attractive ones are detailed. Other implementations of the above principles are not excluded.

5.1.1 Conceptually Simplest Approach

Figure 6:
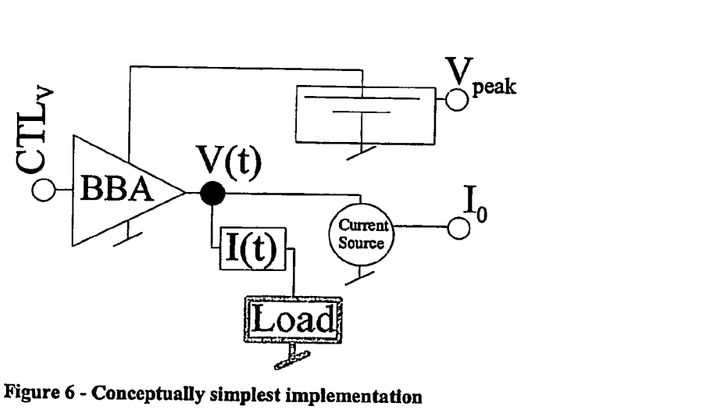
FIG. 6 is a block schematic representation of a simple embodiment of a power supply according to the invention.

The basic solution can be used almost without modifications. We only need to specify control settings more tightly, as is shown in FIG. 6. The actual load is now made very abstract, emphasizing that any load needing rapid change in supply voltage and current may be serviced. The supply will deliver the voltage set by $CTL_V$, limited to $V_{peak}$, with any current up to a maximum given by $I_0$ and the capacity of BBA.

The bandwidth of regulation and the allowable current and voltage variation only depends on the data for the BBA.

Both supplies may be altered by changing the corresponding control signals to suit different long-term operating conditions. The voltage control $V_{peak}$ sets the voltage supply to allow delivery of the maximum voltage. The current control is set to minimize the power consumption.

5.1.2 A Discussion of What is Considered the Technically Simplest Approach.

Figure 7:
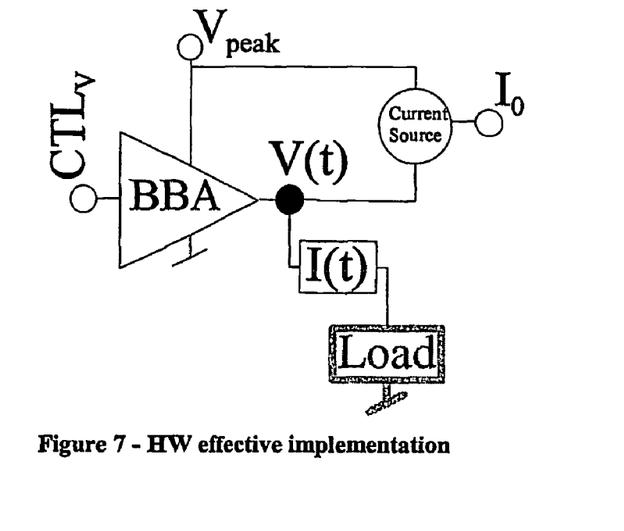
FIG. 7 is a block schematic representation of a hardware efficient embodiment of a power supply according to the present invention.

If the Voltage supply also serves as a power source to the current supply, the circuit can be modified to be fed by a fixed voltage $V_{peak}$, which may be considered to be externally generated. This reduces the unique hardware to be just the current source and the amplifier, as shown in FIG. 7. Fast voltage control is still performed by $CTL_V$. We maintain the setting of $I_0$ to achieve optimum efficiency. It is worthwhile to notice that this arrangement invites to do a simple measurement of $P_{cons}$. The total current drawn from $V_{peak}$ is proportional to $P_{cons}$, being a valid measurement for minimization.

5.1.3 A Discussion of an Agile High-Efficiency Power Supply.

Figure 8:
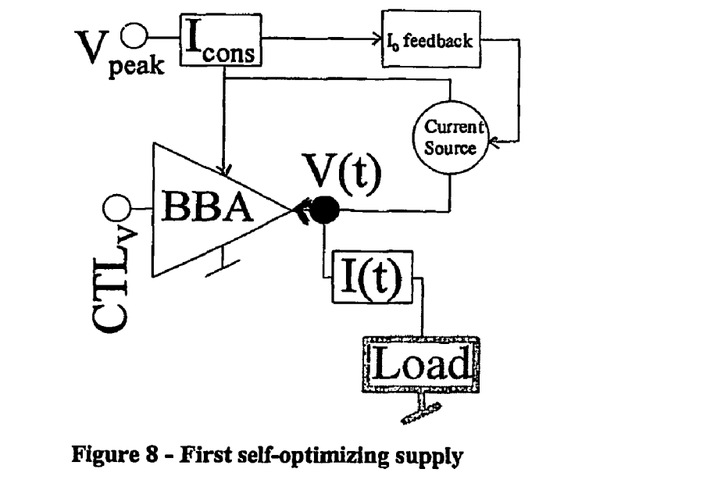
FIG. 8 is a block schematic representation of a first self-optimizing embodiment of an exemplary power supply according to the present invention.

The further discussion is focused on an agile high-efficiency power supply. The simple measurement of $P_{cons}$ leads to a couple of proposals for a complete power supply. The simplest approach assumes a fixed averaging time period and uses a predefined mean-current measurement in a feedback loop to set $I_0$. This is illustrated in FIG. 8. The current measurement value is transferred to the unit $I_0$feedback, which runs an algorithm to shift the value of $I_0$ until the measured current is at minimum. Any algorithm performing this function may be used. The implementation has to take into account that measurement of a mean current takes a certain time after change of $I_0$. The low bandwidth need for setting $I_0$, allows cheap solutions, presumably favoring digital ones.

5.1.4 A Discussion of What of a Self-Adjusting, Agile High-Efficiency Power Supply.

Figure 9:
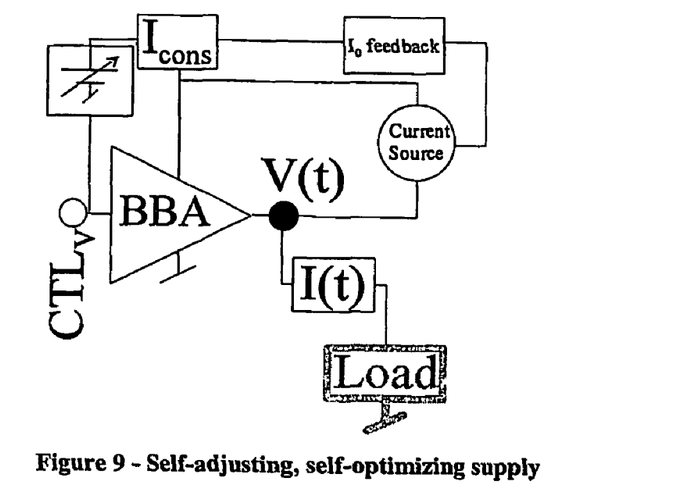
FIG. 9 is a block schematic representation of a self-adjusting, self-optimizing exemplary embodiment of a supply according to the present invention.

The previous solution may be made more user-friendly by including circuitry to adjust the voltage supply based on peak measurement of $CTL_V$. The principle is shown in FIG. 9, where the $CTL_V$ signal is fed to a programmable power supply. An algorithm has to be implemented that sets the output voltage of the supply according to measured peak voltage during intervals at least as long as the averaging time period τ. Implementations of the measurement and the feedback loop may be done in any convenient way, paying attention to the fact that the bandwidth of the feedback loop will be limited by the measurement speed and the headroom for peak voltage.

For versatility, this implementation may contain settings for averaging time and slew rate, where the averaging time should be applied to the peak measurement. The slew rate is introduced to tell how much the peak voltage may increase during the averaging time τ, and is implemented by a setting the supply voltage high enough to allow peak overshoots of that level without clipping.

5.2 Details of Subunits

In the following, details of subunits are discussed. The invention has so far been described on a very high level. We propose examples of implementations for some subunits, not excluding alternative solutions to be used.

Figure 10:
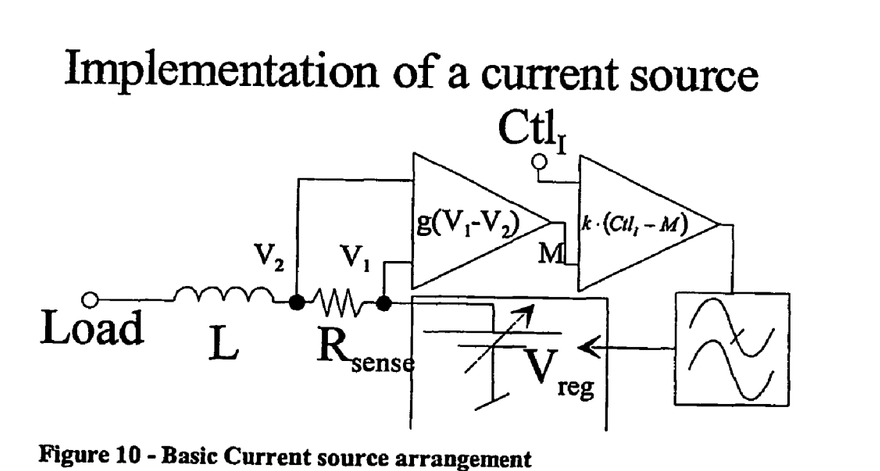
FIG. 10 is a block schematic representation of a basic current source arrangement for a power supply according to the present invention.

An exemplary solution for the current source will now be discussed. Commercially available current sources may do the job, but it seems natural to sketch an implementation of a current source based on a voltage source, as efficient DC-DC converter based voltage sources are commonplace. FIG. 10 shows a proposed implementation where $CTL_I$ is a voltage reference defining the current flowing from the supply to the load.

The small voltage drop over the resistance $R_{sense}$ is used to measure the actual current flowing from the voltage source, and the negative feedback chain stabilizes the current at the desired value. The resistor $R_{sense}$ should be as small as possible to avoid power dissipation. Measurement precision will need a minimum voltage drop, expected to give a negligible power loss.

The amplifier gain, k, may depend on the response to control voltage in the voltage source. The output range may have to be restricted based on voltage source requirements. For the further analysis we assume that the voltage source has an output voltage equal to the control signal voltage, making k the DC gain connecting $Ctl_I$-M to $V_1$.

The low-pass filter has to be designed taking into account the load inductor L that limits the rate of change of the current. Assuming the use in our power supply, we know that the BBA device will act as a low impedance load, and a dimensioning of L becomes possible. First of all, to arrive at a reasonably high impedance current source on the averaging timescale, we have to make sure that the inductance gives high impedance ($Z_0$) to variations at the timescale of averaging:

$$\frac{2 \cdot \pi}{\tau} \cdot L \geq Z_0 \qquad \text{Equation 9}$$

giving $$L \geq Z_0 \cdot \frac{\tau}{2 \cdot \pi}$$

Inductance values can not be made arbitrarily high, so the approach seems most suited for the sub millisecond timescale.

The actual loop design is considered to be according to established knowledge, and is not described here. If the voltage source allows the bandwidth to be limited by the output inductor, we will have a wideband current source, showing high impedance also to long-term load variations. If the gain g is set to be 1/R, the response to current changes will be exactly like the responses to change in $Ctl_I$, basically keeping the current flow constant under changes of load.

Figure 11:
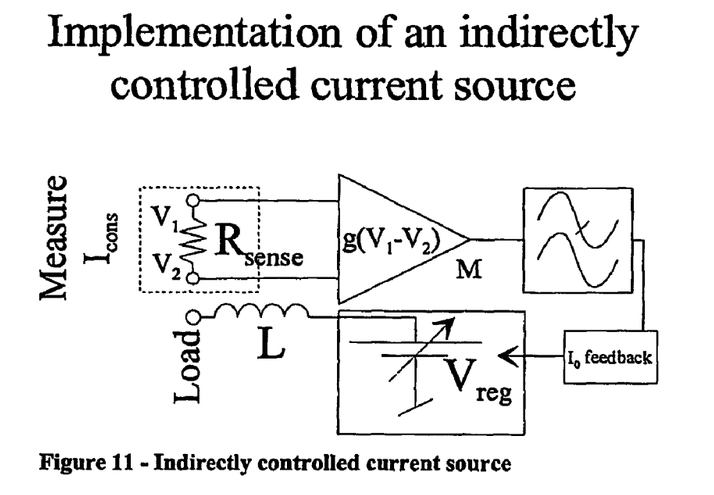
FIG. 11 is a block schematic representation of a principle for an indirectly controlled current source for a power supply according to the present invention.

The current source in this form is suited for use in the implementations suggested above in the sections 5.1.1 and 5.1.2. For other applications, the following solution will be an attractive alternative: An indirectly controlled current source. The implementations suggested above in sections 6.1.3 and 6.1.4 invite to rearrange the current source to be controlled by an indirect measurement. A proposed solution is shown in FIG. 11. The current measurement circuit is now used to measure the consumed current in these implementations. The sense resistor should be connected to $V_{peak}$ at the terminal named $V_1$ and to the loads at the other terminal.

The algorithmic $I_0$ feedback unit from FIG. 8 and FIG. 9 has now been moved into the control loop of the current source. As details of the current measurement is shown, we also take advantage of the fact that the low-pass filter in the feedback loop may be used to establish the average measure of current, fed to the algorithmic unit.

Implementation of this unit is believed to be most conveniently done in the digital domain. This may be easily done based on existing technology.

One analog solution may be arrived at as follows. Cost effectiveness requires synergy with the overall system solution. Use a small amplitude oscillator to perturb $I_0$. Feed the perturbation and the measured current signal to a mixer. The oscillator frequency has to be low enough to receive valid measurement of current response. If that condition is achieved, we will see that the mixer output approaches a DC value, representing the derivative of current subject to the oscillator perturbation. The oscillator voltage is assumed to be offset by a DC voltage that will be shifted in the opposite direction of the mixer output by means of a feedback loop, driving the derivative of current change towards zero. As there will be a very nonlinear response to DC voltage changes (the derivative approaches zero), loop design is assumed to be most effectively done experimentally. Optimum efficiency should be quickly restored after changes in operating conditions.

Figure 12:
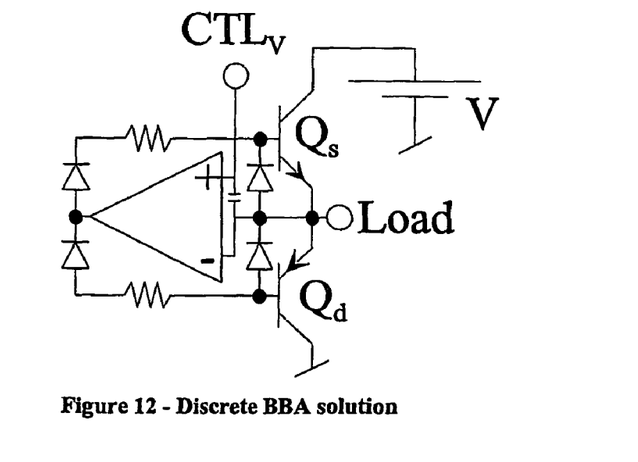
FIG. 12 is a circuit schematic presentation of an exemplary discrete BBA circuit solution for a power supply according to the present invention.

In the following, a solution to the push-pull base band amplifier (BBA) will be discussed. Push-pull amplifiers with high bandwidth and current limits have been found, but they seem not to be commonplace. One alternative solution may be implemented as shown in FIG. 12, not excluding alternatives from being used. Using a NPN-PNP transistor pair with a high-gain control circuit will generally give a very precise voltage control on the output. There is a question mark when the amplifier changes from sourcing current to sinking it. As shown in the figure, that change requires the output of the control amplifier to change the voltage significantly, as it has to change from sourcing the base of $Q_s$ to sinking the base of $Q_d$. This results in a crossover region that essentially can be seen as increased output impedance in that region. The drawing indicates a capacitor connecting $CTL_V$ to Load. This may be beneficial in the crossover region, but has to be traded with stability of the control circuit and impedance of the source of $CTL_V$. The changes from sourcing to sinking current will be smooth in a great class of applications, transforming the crossover question to a question about bandwidth in the control circuit. For that reason the bandwidth should be made as high as possible. Once again a solution will be based on existing knowledge, possibly implying some kind of loop filtering.

5.3 The Application for High Efficiency Amplifiers

The rationale for developing this power supply solution lies in the need for power efficient supplies to amplifiers dealing with rapidly variable signal levels, and we present the most relevant applications as seen from that perspective. This does not exclude other applications of the invention.

5.3.1 An Exemplary Basic Configuration.

Figure 13:
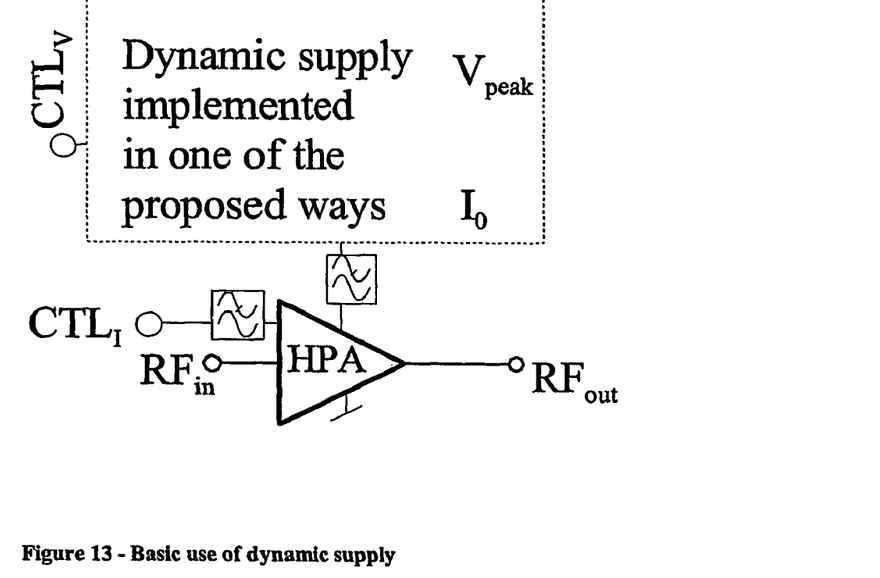
FIG. 13 is a block schematic representation of a basic use of a dynamic supply according to the present invention.

Now, a exemplary basic configuration will be discussed. The lineup shown in FIG. 13 is basically the same as shown in FIG. 4, just having generalized how the supply may be implemented. Any implementation may be used. This way of supplying an amplifier with the power it needs is a fundamental idea behind the development of the supply, and is believed to have its own value.

The supply is capable of delivering any requested combination of voltage and current. With the level statistics of typical modulated RF signals and the corresponding relations between voltage and current, we have seen very high efficiency from this kind of supplies, and the use or such loads is believed to give very favorable performance.

If the implementation requires input for $V_{peak}$ and $I_0$, these values must be supplied. We have shown ways to arrive at the values based on measuring load requirements with time.

If an application would benefit from early warning of future parameter values, they may be set externally. A relevant example may be burst traffic, where such a scheme could be used to put the supply to "sleep mode" between bursts.

The use of $CTL_V$ is well explained above, while the $CTL_I$ is applied directly to the amplifier in question. The normal use of $CTL_I$ is to set the bias level of a transistor gate (FET) or base (Bipolar) to arrive at the desired current consumption. If the amplifier is not operated in class A, the role of $CTL_I$ will be reduced, as the actual signal level will affect the current demand. In specific cases the control may even become unnecessary, only introducing simplifications to the proposed application.

With integrated circuits suitable for this kind of application, we assume that there will be a similar opportunity to control the current consumption.

The idea of changing the supply according to signal level means that the $CTL_I$ and the supply voltage are decoupled from the band pass signal to be amplified maintaining a bias control bandwidth that is consistent with the need for variation, essentially given by the base band bandwidth. Since we have to assume needs for currents and voltages that are nonlinear functions of the signal amplitude, a given multiple of the base band bandwidth will be expected, probably at least a factor of three. This bandwidth requirement is a relevant parameter for the push-pull design discussed above with reference to FIG. 12.

5.3.2 Exemplary Common Source for Voltage and Current Control

Figure 14:
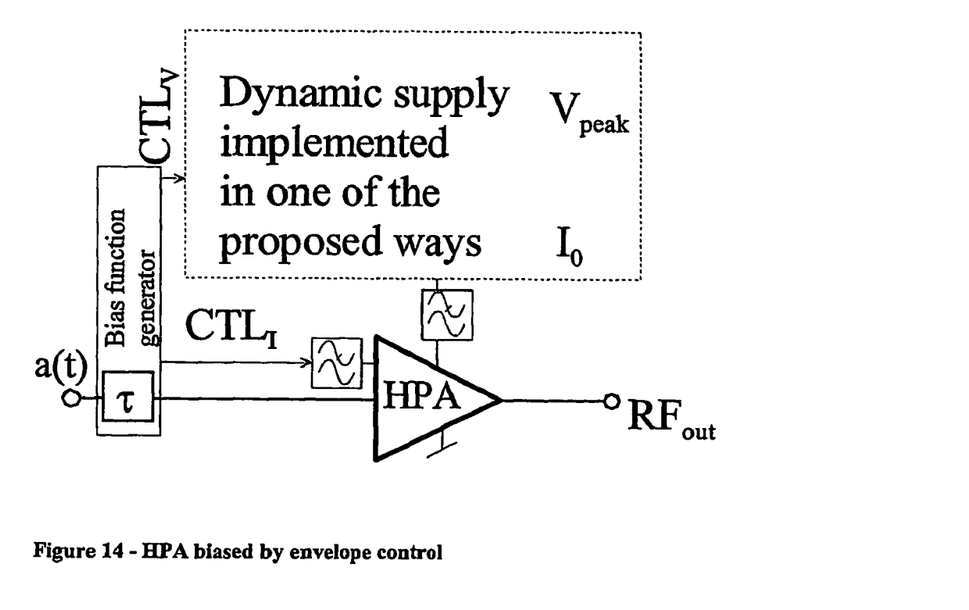
FIG. 14 is a block schematic representation of a high power amplifier biased by envelope control in a power supply according to the present invention.
Figure 15:
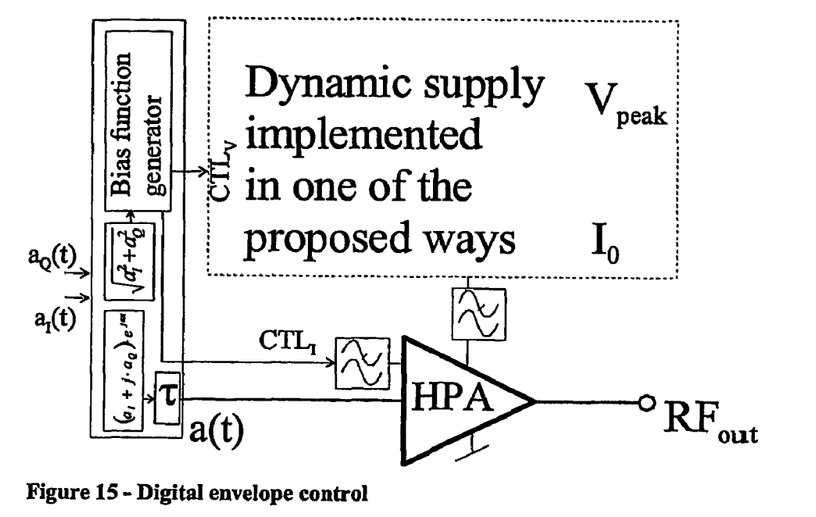
FIG. 15 is a block schematic representation of a digital envelope control in an exemplary embodiment of a power supply according to the present invention.

The idea that we need to adjust bias in accordance with the actual signal level is further detailed in FIG. 14. The fundamental approach is to use the actual modulated signal to evaluate the signal level. This again will be an input to the actual control functions for the voltage and current to the HPA for that signal level.

This all is executed at base band rate, and it is utterly important to align in time the actual signal and the corresponding bias settings. As the bias settings are assumed to be given simultaneously, and require some kind of processing to arrive, we insert a delay in the signal path. This needs to be minutely tuned to ensure that the bias settings are applied to the correct signal level.

If the implementation is done in the analog domain, the ideas revealed by Siemens (see FIG. 2) give a well known platform for implementation. The signal level has to be established by tapping some of the signal and using a detector with sufficient bandwidth to show the envelope variations. This must be input to two analog circuits capable of giving approximately the response functions we want for voltage and current. These responses again must be fed to the corresponding control inputs $CTL_V$ and $CTL_I$. The signal itself may be delayed correspondingly by means of e.g. a delay line.

This approach seems to be somewhat cumbersome. We do not propose any detailed implementation.

5.3.3 Application Based on Digital Generation of the Control Voltages

The previous section basically shows the functions needed also in a digitally based application. The main difference between the two approaches is probably implementation cost and flexibility.

Assuming that we receive completely processed quadrature components of the signal, called $a_I$ and $a_Q$, we for the sum of their squares, giving us the signal to the bias functions. The square root of the sum may not be needed, as it may be integrated into the nonlinear function generation. It is shown for clarity.

The only thing to be performed with the signal itself on its way to the amplifier is modulation and suitable timing alignment. Depending on choice, the timing alignment may come before or after the modulation process, and it is a matter of choice whether the modulation is performed entirely in the digital domain or by the aid of analog quadrature modulator and possible up conversion in frequency.

The digital solution for timing alignment holds the possibility of fine (or even live) adjustment without hardware modifications. As this adjustment is very important, this is assumed to be a great advantage. The DSP solutions for such an alignment are basically known.

5.3.4 Embodiment Suited for Burst Traffic

The extension needed to deal with burst traffic is basically given by taking explicitly control over $V_{peak}$ and possibly $I_0$. If $I_0$ is externally controlled, it means that only the power supply implementations suggested above in 5.1.1 and 5.1.2 are of interest. If not, we can also use the solution suggested above in 0. That option is attractive if the bandwidth of current optimization loop is high enough.

Figure 16:
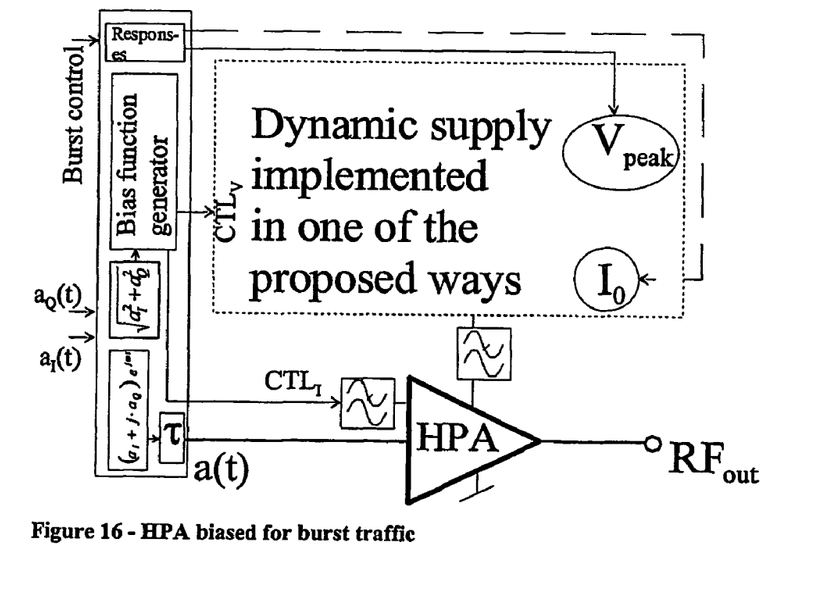
FIG. 16 is a block schematic representation of a high power amplifier biasing arrangement for burst traffic in an exemplary embodiment of the present invention.

Based on the requirements for burst transients, there will be minimum timing requirements for the bias power, and the minimum requirement is that sufficient voltage is available. The upper left logical block in FIG. 16 is controlled by the Burst Control signal, arriving from the traffic management system. The signal tells the planned power level for the burst to come, and arrives at a predefined time before the burst is sent. When triggered, a rise in $V_{peak}$ is generated, sufficient to power up the amplifier as requested.

If the capacity of the BBA-amplifier allows sufficient current to be delivered while optimizing efficiency, no more controls are needed. We assume that we can gain efficiency on having explicit setting of $I_0$, as the actual voltage and current demand is generated by the burst itself. This effectively means that if we preset an optimal current for the burst to come, it will essentially be delivered at zero voltage until the burst arrives—consuming no power. During the burst, we will have an optimum current. At the end of the burst the same will happen; the current source will deliver negligible voltage, while the voltage source will not deliver current. Therefore the $V_{peak}$ and $I_0$ parameters can be set to zero immediately.

If the duty cycle of the burst transmitter is very low, or it is in "listen" mode, the proposed regulation of the supply still may give valuable reduction of power consumption.

More important: The message about the planned level control must be used to read out the actual the $V_{peak}$ to support the signal sent, and the optimum $I_0$ to set for optimal efficiency. This mechanism ensures a burst-to-burst optimal power supply efficiency.

Figure 17:
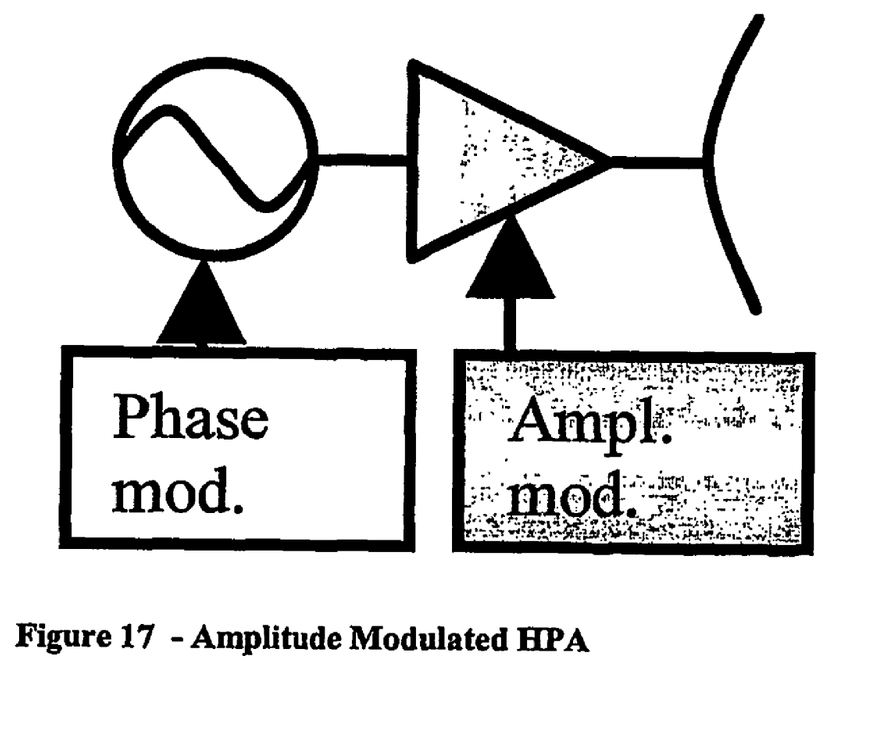
FIG. 17 is a block schematic representation of an exemplary amplitude modulated high power amplifier by way of a power supply according to the present invention.

5.4 Applications of the Invention for Supply-Driven Modulation of Amplifier Output Level A natural extension of the range of applications for such a power supply includes the use for modulation of amplifier output level. In some radio architectures a transmitted signal may be constructed by generating a constant-level, phase modulated signal that becomes amplitude modulated in the power amplifier by means of varying the bias supply, typically like what is shown in FIG. 17. It is necessary to assure correct alignment of the two contributions to the modulation, taking into account the response functions of the modulating units. This task is naturally managed from a digital modem.

The amplifiers in question may be of any desired construction as long as the output level may be controlled by means of the applied supply voltage. The core invention enables a very power efficient transmit chain as we under all circumstances need a frequency source. Modulating the phase on this source enables use of high-class amplifiers until the last stage, ensuring a maximum power added efficiency so far. Some high-class amplifiers are suitable for amplitude modulation, promising high efficiency for the entire transmit chain.

The invention claimed is:

1. An electronic power supply circuit, particularly suitable for supplying power to an ultra high or microwave radio frequency power amplifier with a high frequency varying power demand, said power supply circuit having a supply output arranged for connecting to an input of said ultra high or microwave radio frequency power amplifier, said power supply circuit comprising:

a variable voltage supply circuit having a voltage output and a control input, said voltage supply circuit comprising a voltage divider series circuit of two controllable current limiting electronic linear devices connected across a voltage source input, each of said devices having a device control input in communication with said voltage supply control input via a control circuit, said linear devices and control circuit being arranged to operate at a control rate substantially corresponding to said high frequency, said control input being applied to said linear devices for controlling a voltage at a point of said series circuit located between said two linear devices, said point being connected to said supply output; and a switched mode type variable current supply of low electrical power dissipation connected to said supply output, wherein the switched mode type variable current supply is arranged to maximize an efficiency of the electronic power supply circuit, and to deliver a current appearing as a substantially constant current when plotted at a scale for observing a signal of a frequency corresponding to said ultra high or microwave radio frequency or at a scale for observing a signal of a frequency corresponding to said high frequency variation.

2. The power supply of claim 1, wherein the controllable voltage supply circuit is arranged to provide a voltage output substantially proportional to a control signal input to said voltage supply circuit control input.

3. The power supply of claim 1, wherein said two current limiting electronic devices are selected from a bipolar semiconductor type device, a FET semiconductor type device or a vacuum tube type device.

4. The power supply of claim 1, wherein the series circuit of two electronic linear devices constitutes a pushpull circuit arrangement.

5. The power supply of claim 1, further comprising:

a power input for supply of electric power to the variable voltage supply circuit and the switched mode type variable current supply; and a control loop including an input power measuring device arranged to measure electrical power at the power input, and an efficiency optimizer arranged to receive an input power measurement from the input power measuring device and to output a current setting control signal to the switched mode type variable current supply in response to input power measurement so as to minimize the input power with the electronic power supply circuit being operational and supplying power to the ultra high or microwave radio frequency power amplifier.

6. The power supply of claim 1, wherein the input for supply of electric power to the variable voltage supply circuit is an input for supply of electric power at a constant voltage (Vpeak), the input power measuring device is arranged to measure electrical input power by measuring electrical input current at the power input, and the efficiency optimizer comprises a current setting controller arranged to alter the current setting control signal to determine a value for the current setting control signal at which the electrical input current is substantially at a minimum.

7. The electronic power supply circuit of claim 6, wherein the efficiency optimizer is arranged to alter the current setting control signal at a rate being substantially less than a variation rate of the high frequency varying power demand.

8. The electronic power supply circuit of claim 6, wherein the efficiency optimizer is arranged to maintain the current setting control signal at a value at which the electrical input current is substantially at a minimum.

9. The electronic power supply circuit of claim 6, wherein the efficiency optimizer is arranged to maintain the current setting control signal at a value at which the electrical input current is at substantially a minimum in response to a change in said constant voltage (Vpeak).

10. The electronic power supply circuit of claim 1, wherein said variable current supply circuit is a arranged to operate at a control rate substantially below said high frequency, and said power supply circuit further comprising:

a means for quantifying electric power dissipated by said two linear devices and being connected by a control means to a control input of said variable current supply circuit for controlling a current delivered by said variable current supply circuit such that the electric power dissipated by the electronic linear devices is suggested to a minimum while the controllable voltage supply circuit is suggested to meet the high frequency variation power demand of the power amplifier.

11. The power supply of claim 10, wherein said means for quantifying electric power dissipated by said two current limiting linear devices is arranged to operate on basis of an output of a means for sensing dissipated power.

12. The power supply of claim 11, wherein said means for sensing electric power dissipated by said two linear devices operates on basis of said voltage at said supply output, a current delivered from said supply output to the amplifier and a current delivered from said current supply to said supply output.

13. A variable gain ultra high or microwave radio frequency power amplifier assembly for providing high level high frequency modulation of a radio frequency signal, wherein said power amplifier assembly including an electronic power supply circuit according to claim 1, and wherein the gain of a radio frequency power amplifier element is arranged to controlled by said power supply output voltage, and said variable voltage supply circuit control input being arranged to receive a high frequency variation modulating signal, whereby a high level modulated radio frequency signal is producible from an ultra high or microwave radio frequency signal being input to said power amplifier assembly.

14. A method for supplying electrical power to an ultra high or microwave radio frequency power amplifier amplifying a ultra high or microwave radio frequency signal having a power demand varying at high frequency rate, using a power supply having an output connected to a amplifier power supply input of said ultra high or microwave radio frequency power amplifier, said method comprising:

delivering to said output a voltage by a variable voltage supply having a voltage output and a control input and including a series circuit of at least two current limiting electronic linear devices of a conductivity arranged to be controlled at a rate corresponding to at least the high frequency rate of said high frequency power demand variation, which series circuit is arranged to be connected to a substantially constant voltage source of electrical power, which voltage output is at a point of said series circuit located between two of said at least two electronic linear devices, which control input is arranged to be connected to a control means for controlling a voltage at said voltage output in accordance with said power variation; and delivering to said output, by a variable switched mode current supply of low electrical power dissipation being arranged to maximize the efficiency of the electronic power supply circuit and connected to said output, a current appearing as a substantially constant current when plotted at a scale for observing the radio frequency of said ultra high or microwave radio frequency signal or a scale for observing the high frequency rate power variation.

15. The method of claim 14, wherein the control means is arranged for controlling said voltage at said voltage output proportionally according to said power variation.

16. The method of claim 14, wherein said at least two current limiting electronic linear devices are selected from a group including a bipolar semiconductor type device, a FET semiconductor type device and a vacuum tube type device.

17. The method of claim 14, wherein said series circuit of said at least two electronic linear devices and part of said control means constitutes a pushpull circuit arrangement.

18. The method of claim 14, wherein said power amplifier has an amplifier control input for setting power amplifier current consumption, which amplifier control input is in communication with a means for delivering a control signal that is representative of said high frequency rate power variation.

19. The method of claim 14, further comprising:
providing a power input for supply of electric power to the variable voltage supply circuit and the switched mode type variable current supply; and
operating a control loop including an input power measuring device to measure electrical power at the power input, and an efficiency optimizer to receive an input power measurement from the input power measuring device, and to output a current setting control signal to the switched mode type variable current supply in response to input power measurement so as to minimize the input power with the electronic power supply circuit being operational and supplying power to the ultra high or microwave radio frequency power amplifier.

20. The method of claim 14, further comprising:
providing electric power at a constant voltage (Vpeak) at the input for supply of electric power;
operating the input power measuring device to measure electrical input power by measuring electrical input current at the power input; and
operating in the efficiency optimizer a current setting controller to alter the current setting control signal to determine a value for the current setting control signal at which the electrical input current is substantially at a minimum.

21. The method of claim 20, further comprising:
operating the efficiency optimizer to alter the current setting control signal at a rate being substantially less than a variation rate of the high frequency varying power demand.

22. The method of claim 20, wherein operating the efficiency optimizer is arranged to maintain the current setting control signal at a value at which the electrical input current is substantially at a minimum.

23. The method of claim 20, further comprising:
operating the efficiency optimizer to maintain the current setting control signal at a value at which the electrical input current is at substantially a minimum in response to a change in said constant voltage (Vpeak).

24. The method of claim 14, further comprising:
quantifying electric power dissipated by said at least two electronic linear devices, which variable current supply has a control input in communication with an output of said means for quantifying electric power dissipated by said electronic linear devices and is arranged to operate at a control rate that is substantially less than the high frequency rate of said high frequency power variation, and minimizing overall electric power dissipated by the power supply circuit when operational by controlling current delivered by the current supply to a value at which quantified electric power dissipated by said at least two electronic linear devices is at a minimum.

25. The method of claim 24, wherein said means for quantifying electric power dissipated by said at least two electronic linear devices operates on basis of an output of a means for sensing dissipated power.

26. The method of claim 24, wherein said means for quantifying electric power dissipated by said at least two electronic linear devices includes means for sensing said dissipated power.

27. The method of claim 24, wherein said means for quantifying electric power dissipated by said at least two electronic linear devices operates on basis of said voltage at said voltage output, a current delivered form said output to said amplifier and a current delivered by said controllable current supply.

28. The method of claim 24, wherein said means for quantifying electric power dissipated by said at least two electronic linear devices operates on basis of a predefined set of operational parameters maintained in a memory device.

* * * * *